(12) United States Patent
Barth et al.

(10) Patent No.: US 7,733,107 B1
(45) Date of Patent: Jun. 8, 2010

(54) CHARGED DEVICE MODEL CONTACT PLATE

(76) Inventors: Jon E. Barth, 1589 Foothill Dr., Boulder City, NV (US) 89005-2718; John R. Richner, 1589 Foothill Dr., Boulder City, NV (US) 89005-2718

( * ) Notice: Subject to any disclaimer, the term of this patent is extended or adjusted under 35 U.S.C. 154(b) by 216 days.

(21) Appl. No.: 11/853,570

(22) Filed: Sep. 11, 2007

Related U.S. Application Data

(60) Provisional application No. 60/825,270, filed on Sep. 11, 2006.

(51) Int. Cl.
*G01R 31/02* (2006.01)

(52) U.S. Cl. .................. 324/758; 324/555; 324/537; 324/756; 324/757

(58) Field of Classification Search .................. None
See application file for complete search history.

(56) References Cited

U.S. PATENT DOCUMENTS

| | | | |
|---|---|---|---|
| 5,132,612 A | | 7/1992 | Burns et al. |
| 5,274,336 A | * | 12/1993 | Crook et al. ............. 324/690 |
| 5,543,728 A | * | 8/1996 | Grace et al. ............. 324/763 |
| 5,565,788 A | * | 10/1996 | Burr et al. ............... 324/762 |
| 5,594,358 A | | 1/1997 | Ishikawa et al. |
| 5,642,056 A | | 6/1997 | Nakajima et al. |
| 6,512,362 B1 | | 1/2003 | Gieser |
| 2001/0038294 A1 | * | 11/2001 | Matsunaga et al. ......... 324/754 |

* cited by examiner

*Primary Examiner*—Timothy J Dole
*Assistant Examiner*—John Zhu
(74) *Attorney, Agent, or Firm*—Kenehan & Lambertsen, Ltd.; John C. Lambertsen

(57) ABSTRACT

A tester for applying very fast transmission line pulses ("VFTLP") to select pins of a device under test ("DUT"), for example, an integrated circuit. The tester also provides for leakage measurement testing of the DUT after VFTLP testing. An end of a coaxial cable is received within an aperture formed in a metal ground plane. The outer conductor of the coaxial cable is attached to the metal ground plane and the inner conductor of the coaxial cable projects above an upper surface of the metal ground plane. A grip attached to the metal ground plane selectively retains the DUT upon the upper surface of the metal ground plane in a position placing a select pin in physical contact with the projecting inner conductor of the coaxial cable, completing the VFTLP circuit.

6 Claims, 1 Drawing Sheet

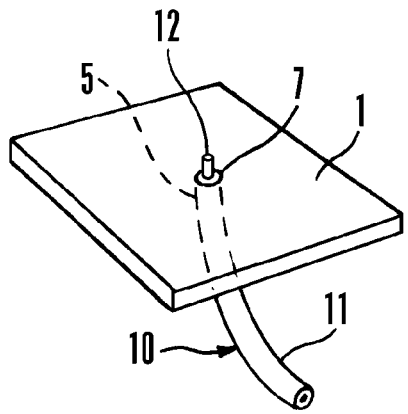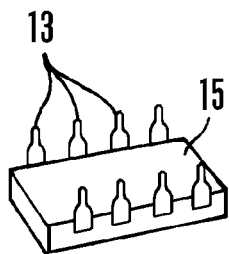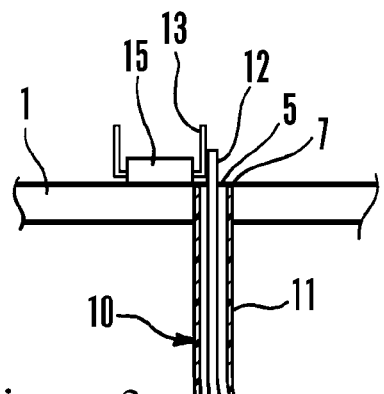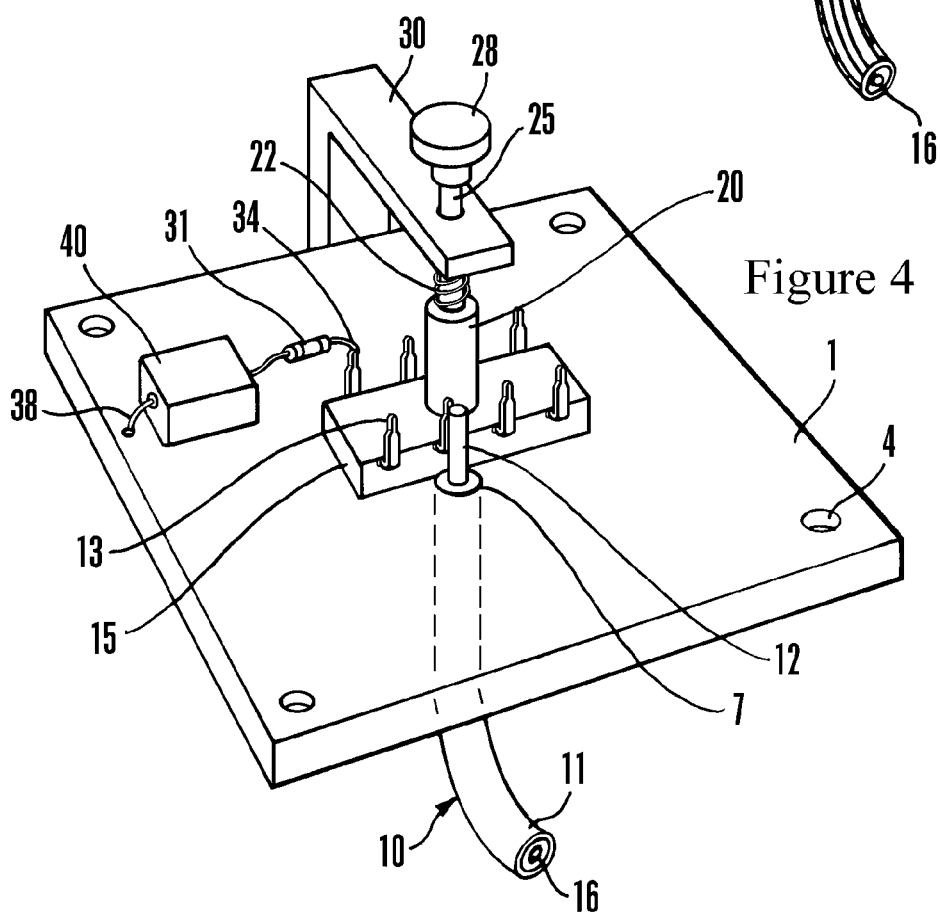

US 7,733,107 B1

CHARGED DEVICE MODEL CONTACT PLATE

CROSS-REFERENCE TO RELATED APPLICATION

This application claims the benefit of U.S. Provisional Application Ser. No. 60/825,270, filed Sep. 11, 2006.

TECHNICAL FIELD

The present invention relates to an apparatus for Charged Device Model testing. More specifically, the present invention relates to a Very Fast Transmission Line Pulse (VFTLP) system for measuring current and voltage characteristics of an Integrated Circuit (IC) by establishing electrical connections between a VFTLP source and selected pins of the IC device under test (DUT).

BACKGROUND ART

Making Charged Device Model (CDM) type measurements on an integrated circuit (IC) with Very Fast TLP system test pulses requires a method to secure the IC in a location while making a low parasitic inductance electrical connection to one of its pins. The present specification describes a physical method to connect an electrical system to one pin of an IC and secure it while measuring its electrical parameters in sub-nanosecond times.

Commercial CDM testers hold an IC "dead bug" style on a metal plate and place a ground plane parallel to the ground plane above it with a coaxial cable and a compressible contact pin (known as a "pogo pin" in the electronics industry) connected to the inner conductor of the coaxial cable. A fast response one-ohm resistor is placed at the junction between the pogo pin and the inner conductor of the coaxial cable to act as a current sensor and monitor pulse discharge currents. The ground plane and pogo pin are moved down to make contact with a charged IC to discharge one pin of the IC and measure its discharge current. This test is continued to analyze each pin on the IC to determine the lowest voltage where failure occurs.

Very Fast Transmission Line Pulse (VFTLP) systems use a charged transmission line that is discharged to generate a rectangular pulse with a very fast rise time. The test pulse rise time in VFTLP can be as fast as 50 picoseconds, and can be slower than 1000 picoseconds.

VFTLP test systems simulate the rise time and width of CDM events to identify electrical characteristics of protection circuits. The present invention provides a ground plane upon which an IC is placed near a conductor that applies very fast rising pulses to a pin of the integrated circuit and measures its current and voltage response to the pulse applied from the outside of the IC. This test can identify two fundamentally different parameters based upon current and voltage measurements of the IC.

To obtain such information, the VFTLP system measures the resulting voltage and current response to these pulses by two methods. The original measurement averages the measured I-V data over a time window part way through the test pulse, after the semiconductor conductivity has reached its steady state condition and settled down for a nanosecond or more. The IC is held down to the ground plane and the current pulse from a controlled source impedance is conducted into the pin being tested to form an exponentially decaying current discharge. The exponential discharge rate is determined by the capacitance of the IC internal connections through the package insulation to the metal ground plane upon which it sits.

The second measured parameter of the IC using the VFTLP is the rate the semiconductor conductivity increases immediately after the test pulse is applied to the IC. Such measurement identifies how rapidly the semiconductor reaches its steady state conduction condition.

While the conduction is increasing it produces a significant voltage overshoot, which is the primary threat to the thin gate oxides used in modern IC's. The voltage impulse threat can be approximately measured in the early part of the pulse before the voltage charge increases as the current decreases. The time can be from a fraction of a nanosecond to a few nanoseconds, and is increasingly becoming important information in CDM design technology.

VFTLP systems typically use the commonly available 50 ohm characteristic impedance coaxial cables, connectors and the accessories used to generate, transfer, and measure the current and voltage (I-V) waveforms. The time varying current and voltage of the semiconductor circuit/s on a silicon chip inside an IC package is identified by applying different amplitude, fast-rising pulses to the DUT ("device under test") and measuring the current and voltage reflected from it. For very fast time domain measurements, the coaxial cable connection to the DUT must have very low parasitic inductance.

SUMMARY OF THE INVENTION

Locating the connection of the 50 ohm impedance transmission line physically close to the DUT lead, pin, or contact minimizes parasitic inductance errors—which increases measurement errors. Such an arrangement insures that the measured very fast data is that of the Device Under Test (DUT), with minimal effect from parasitic inductance in the connection to the DUT contact being tested.

In addition by connecting a ground or reference pin of the DUT to ground during a leakage test the failure level where leakage increases after application of a test pulse can be determined. By using a low capacitance medium value miniature resistor and a low capacitance relay to ground the reference pin during the leakage test the minimal added capacitance of the resistor and open relay will not affect the discharge current waveform.

Some further objects and advantages of the present invention shall become apparent from the ensuing description and as illustrated in the accompanying drawings.

BRIEF DESCRIPTION OF THE DRAWINGS

FIG. 1 is a perspective view, with portions in phantom, showing attachment of the transmission line to a ground plane in accordance with the present invention.

FIG. 2 is a typical Dual Inline Package ("DIP").

FIG. 3 is a cross section drawing of the test coax projecting through the ground plane with its outer conductor in intimate electrical contact with the ground plane and its inner conductor in intimate electrical contact with the pin or lead of the IC being tested.

FIG. 4 is a perspective view showing a charged device model contact plate in accordance with the present invention.

DETAILED DESCRIPTION OF THE PREFERRED EMBODIMENTS

Reference is now made to the drawings wherein like numerals refer to like parts throughout. In FIG. 1, a metal ground plane 1 represents a physical and electrical reference. To maintain minimal parasitic inductance between an end 5 of a 50-ohm characteristic impedance coax 10, the end 5 is passed through an aperture 7 formed in the ground plane 1, and electrically connected to the metal ground plane 1 using solder or other commonly used methods of making electrical and physical connections between metals. The coax 10 consists of an outer conductor 11 and an inner conductor 12, the latter of which is shown projecting above the ground plane 1 in FIG. 1.

As is shown in FIG. 2, a plurality of conductive leads 13 extend from a DUT 15. To provide access to the plurality of leads 13, the DUT 15 is held down to the metal ground plane 1 in "dead bug style" (FIG. 3). The capacitance between the semiconductor chip and lead frame conductors inside the DUT 15 and the plurality of leads/pins 13, acts as one electrode of a capacitor while the ground plane 1, is the other electrode.

The inner conductor 12 of the end of the 50-ohm coaxial cable 5 can be a SMA connector mounted to the bottom of the ground plane 1 or the outer conductor 11 is preferably a copper jacket, which can be soldered directly to the walls of the aperture 7 in the ground plane 1, through which it passes. Other RF panel-mount type connectors of small diameter inner conductors can also be used without departing from the present invention.

The inner conductor 12, of the 50-ohm coaxial transmission line 10, is a single short conductor pressed against the IC lead to be tested, or soldered to it and provides a very low inductance connection to the pin 13 being tested on the IC 15. This connection between the inner conductor 12 and DUT pin 13 is spaced as close to the DUT 15 as is physically possible—causing contact between the inner conductor 12 and the pin 13 on the DUT 15 to be made at the closest possible spacing to where the pin 13 exits the DUT package 15.

Such close spacing provides for minimum parasitic inductance between the inner conductor 12 and the pin 13 being tested. This mounting and the connections closely simulate the real CDM discharge threat. Any excess length of the inner conductor 12 extending past the DUT pin 13 will likely cause only a slight amount of parasitic capacitance. However, should the testing show too much parasitic capacitance caused by excessive length of the inner conductor 12 or the DUT pin 13, the excess length can be cut shorter. A second end 16, of the coaxial cable 10 is connected to the VFTLP system that supplies the measurement pulses to the DUT pin 13 being tested.

The IC package/DUT 15 is held tightly to the ground plane 1 by an insulating rod 20 and a rod spring 22. The insulating rod 20 is preferably fabricated out of plastic, and is attached to a support rod 25 having a smaller diameter. The support rod is in turn attached to a grip 28, that enables a user (not shown in the drawings) to easily lift the insulating rod 20 when necessary to reposition the DUT pin 13 that is to be tested against the coaxial cable inner conductor 12 prior to application of the pulse current. The insulating rod 20, the rod spring 22, the support rod 25 and the grip 28 are held in place using a support bracket 30 that is mounted to the ground plane with adjustable screws for convenient positioning to held different sizes of the IC's/DUT's 15 in proper location for connection of whichever pin 13 is connected to the test coax inner conductor 12.

When very fast-rising test pulses are externally applied to a single pin of an IC, the current flow through the pin into the internal connections will have very similar waveform to the CDM discharge current that is generated internally. The CDM discharge current leaves that same pin when a CDM test is made with a charged IC.

Since the sensors in a VFTLP system can measure the very fast pulse characteristics created by the DUT lying on the ground plane, it will closely simulate the CDM current waveform. The time for the rectangular pulse current to decay to the 1/e (36.8%) amplitude will depend on the IC capacitance to the ground plane and the test pulse source impedance.

This test method does not produce the same resonance in the exponential decay current waveform found in the typical CDM tester because in this test the DUT is directly lying on the ground plane, while the CDM tester uses an isolated ground plane placed above the DUT and adds a resonance to the discharge current waveform. The information from this test should use a rectangular pulse that is about twice the discharge length of time so the peak amplitude will be approximately equal to the energy in the CDM discharge event.

By connecting a low capacitance resistor 31 to a different pin 34 than that being tested, such as a ground or Vdd or Vss pin and providing a ground return path 40 during the typical VFTLP leakage test with a low capacitance single pole single throw relay 38, the test pulse amplitude which causes failure inside the package can be determined with the package insitu. Other CDM test methods require the DUT to have all pins pulse discharge tested at the same amplitude after which the package is then removed from the CDM tester and leakage measurements are made on all pins to determine if that test amplitude caused any pin to fail from increased leakage current.

Ball Grid Array (BGA) packages will need a special connection that will be similar to the CDM tester with a ground plane through which the coaxial cable from the VFTLP pulse is delivered to the ball being tested. This method will require a test fixture similar to the CDM tester. The coaxial cable will extend past the ground plane in the same way, but a BGA chip will have to lie on a second ground plane with its balls facing up. The coaxial cable inner conductor extending past the first ground plane will make contact with the ball to be tested, and the capacitive coupling between the first ground plane and the second ground plane will provide the capacitive ground plane return displacement current.

Since the second ground plane will hide the balls on the BGA package, a separate BGA package of the same spacing and alignment can be located at a precise spacing from the IC being tested with a single locating pin having the same precise spacing from the coaxial cable inner conductor to provide a more convenient positioning of the pin to contact the solder ball of the BGA.

Our invention has been disclosed in terms of a preferred embodiment thereof, which provides a charged device model contact plate that is of great novelty and utility. Various changes, modifications, and alterations in the teachings of the present invention may be contemplated by those skilled in the art without departing from the intended spirit and scope thereof. It is intended that the present invention encompass such changes and modifications.

We claim:

1. A Charged Device Model tester comprising:
   a metal ground plane, said ground plane having an aperture formed therein;
   a coaxial cable received within said aperture and attached to said ground plane, said coaxial cable having an inner conductor and an outer conductor, said outer conductor in electrical communication with said metal ground plane and said inner conductor extending from said coaxial cable to define a terminal contact segment of said inner conductor;

a DUT positioner selectively mounted to said ground plane enabling placement of a DUT upon said metal ground plane and in electrical communication therewith at a location substantially proximate said terminal contact segment of said inner conductor, wherein a first end of said coaxial cable is concentrically positioned within and attached to said metal ground plane along a substantial length of a perimeter adjacent said aperture, and wherein said terminal contact segment of said inner conductor extends in a perpendicular manner from said metal ground plane; and a low capacitance single pole single throw relay attached to said metal ground plane and in electrical communication therewith, said low capacitance single pole single throw relay having an electrical lead attached thereto, said electrical lead including a low capacitance resistor, whereby electrical connection of said electrical lead to said DUT enables an insitu VFTLP leakage analysis.

2. A Charged Device Model tester comprising:

a metal ground plane, said ground plane having an aperture formed therein;

a coaxial cable received within said aperture and attached to said ground plane, said coaxial cable having an inner conductor and an outer conductor, said outer conductor in electrical communication with said metal ground plane and said inner conductor extending from said coaxial cable to define a terminal contact segment of said inner conductor;

a DUT positioner selectively mounted to said ground plane enabling placement of a DUT upon said metal ground plane and in electrical communication therewith at a location substantially proximate said terminal contact segment of said inner conductor; and a low capacitance single pole single throw relay attached to said metal ground plane and in electrical communication therewith, said low capacitance single pole single throw relay having an electrical lead attached thereto, said electrical lead including a low capacitance resistor, whereby electrical connection of said electrical lead to a DUT enables an insitu VFTLP leakage analysis.

3. A tester for Very Fast Transmission Line Pulse loading of integrated circuits, comprising:

a metal ground plan for receiving a device under test comprising one or several integrated circuits to be tested, said metal ground plane having an aperture formed therein;

a pulse injector that comprises a reference electrode, a contact electrode, and a support for said contact and reference electrodes, wherein said reference electrode comprises an outer conductor of a coaxial cable, said outer conductor is attached to and in electrical communication with said metal ground plane, wherein said contact electrode comprises an inner conductor of said coaxial cable, wherein a first end of said coaxial cable is received within said aperture, wherein said support for said contact and reference electrodes comprises said metal ground plane, wherein said outer conductor is attached to said metal ground plane adjacent an inner peripheral edge of said aperture, and wherein said inner conductor of said coaxial cable extends beyond said first end of said coaxial cable and projects in a perpendicular manner from said metal ground plane; and a low capacitance single pole single throw relay received by and in electrical communication with said metal ground plane, said low capacitance single pole single throw relay having an electrical lead attached theretowith, and selectively engageable with said device under test to enable an insitu VFTLP leakage analysis.

4. A tester according to claim 3, wherein said projecting end of said inner conductor of said coaxial cable comprises said contacting terminal of said pulse injector.

5. A tester according to claim 4, and further comprising a grip attached to said metal ground plane and selectively engageable with said device under test, restricting the movement thereof when said device under test is received upon said metal ground plane.

6. A tester according to claim 3, wherein said electrical lead includes an in-line low capacitance resistor.

* * * * *